(12) United States Patent
Jang et al.

(10) Patent No.: US 10,074,329 B2
(45) Date of Patent: Sep. 11, 2018

(54) SHIFT REGISTER

(71) Applicant: LG Display Co., Ltd., Seoul (KR)

(72) Inventors: Yong-Ho Jang, Goyang-si (KR); Woo-Seok Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 224 days.

(21) Appl. No.: 14/835,631

(22) Filed: Aug. 25, 2015

(65) Prior Publication Data

US 2016/0253976 A1     Sep. 1, 2016

Related U.S. Application Data

(60) Provisional application No. 62/126,329, filed on Feb. 27, 2015.

(51) Int. Cl.
*G11C 19/00*        (2006.01)
*G09G 3/36*         (2006.01)
*G11C 19/28*        (2006.01)

(52) U.S. Cl.
CPC ........... *G09G 3/3677* (2013.01); *G11C 19/28* (2013.01); *G09G 2310/0286* (2013.01)

(58) Field of Classification Search
None
See application file for complete search history.

(56) References Cited

U.S. PATENT DOCUMENTS

| 7,215,315 | B2 * | 5/2007 | Morosawa | G11C 19/28 345/100 |
| 8,023,610 | B2 * | 9/2011 | Miyayama | G11C 19/28 377/64 |
| 8,107,586 | B2 * | 1/2012 | Shin | G09G 3/3677 377/64 |
| 8,422,621 | B2 * | 4/2013 | Jang | G09G 3/3677 377/64 |
| 8,867,697 | B2 * | 10/2014 | Jang | G09G 3/3677 377/64 |
| 9,368,230 | B2 * | 6/2016 | Yao | G11C 19/184 |
| 2008/0002805 | A1 * | 1/2008 | Tobita | G11C 19/28 377/64 |
| 2008/0219401 | A1 * | 9/2008 | Tobita | G09G 3/3677 377/79 |
| 2010/0245300 | A1 * | 9/2010 | Chan | G09G 3/3677 345/204 |
| 2014/0354655 | A1 * | 12/2014 | Kim | G06T 1/20 345/501 |

(Continued)

*Primary Examiner* — Tuan T Lam
(74) *Attorney, Agent, or Firm* — Fenwick & West LLP

(57) ABSTRACT

Disclosed is a shift register capable of preventing charges supplied to a Q node to turn on a pull-up transistor for outputting a scan pulse from leaking outwards. The shift register includes a plurality of stages connected to gate lines formed at a panel. Each stage includes a scan signal generator for generating a scan pulse or a turn-off signal, a scan pulse controller for generating a Q-node control signal for generation of the scan pulse, a Q-node adjuster for preventing the Q-node control signal from leaking outwards during supply of the Q-node control signal to a Q-node connected to the scan signal generator, and a turn-off signal controller for transferring a Qb-node control signal for generation of the turn-off signal to the scan signal generator via a Qb-node when no scan pulse is generated from the scan signal generator.

20 Claims, 12 Drawing Sheets

(56) References Cited

U.S. PATENT DOCUMENTS

2015/0317954 A1* 11/2015 Jang .................. G09G 3/20
                                                    345/213
2016/0267854 A1*  9/2016 Kim .................. G09G 3/3466

* cited by examiner

Prior Art

Prior Art

Prior Art

Prior Art

SHIFT REGISTER

This application claims the benefit of U.S. Provisional Patent Application No. 62/126,329, filed on Feb. 27, 2015, which is hereby incorporated by reference.

BACKGROUND OF THE INVENTION

Field of the Invention

The present invention relates to a shift register and, more particularly, to a shift register capable of performing stable operation.

Discussion of the Related Art

A shift register sequentially outputs a plurality of scan pulses and, as such, sequentially drives gate lines of a display device such as a liquid crystal display (LCD) device.

To this end, such a shift register includes a plurality of stages to sequentially output scan pulses.

FIG. 1 is a circuit diagram illustrating a configuration of a stage applied to a conventional shift register. FIG. 2 is a timing diagram depicting waveforms of input and output signals of the stage applied to the conventional shift register of FIG. 1. FIG. 3 is a diagram illustrating characteristics of a relationship between gate voltage and drain current according to temperature of a conventional oxide semiconductor transistor. FIG. 4 is a timing diagram depicting waveforms when the conventional shift register of FIG. 1 operates normally and abnormally.

Generally, a shift register includes a plurality of stages. An output signal 'Vout' output from each stage is a scan signal 'SS' to be transferred to gate lines formed at a panel.

The scan signal 'SS' includes a scan pulse having a turn-on voltage capable of turning on a switching element of each pixel connected to each gate line, and a turn-off signal for maintaining the switching element in an off state for a remaining period of one frame.

Generally, each of the stages outputs the scan pulse once during one frame and, as such, the scan pulse is output in a sequential manner from the stages.

As shown in FIG. 1, each of the stages includes a pull-up switching element T6 to be turned on or off in accordance with the logic state of a Q-node, and to receive a first clock signal CLK1 in an on state, thereby outputting the scan pulse, a pull-down switching element T7 to be turned off when the pull-up switching element T6 is turned on, and to be turned on when the pull-up switching element T6 is turned off, thereby outputting the turn-off signal, and a Q-node control switching element T2 connected between the Q-node and a discharge voltage source 'VSS', to be controlled by a control signal.

Each stage may include at least one element performing the function of the Q-node control switching element T2.

Generally, the control signal, which is input to a gate of the Q-node control switching element T2, is maintained in a low level state when the Q-node is in a high level state.

That is, when a high-level signal A is input to the Q-node, the pull-up switching element T6 is turned on and, as such, the scan pulse is output. In this case, no discharge voltage from the discharge voltage source 'VSS' is supplied to the Q-node control switching element T2 unless the Q-node control switching element T2 is turned on.

When the scan pulse is output, the high-level control signal A is input to the gate of the Q-node control switching element T2 and, as such, the Q-node control switching element T2 is turned on. In this case, the discharge voltage is supplied to the gate of the pull-up transistor T6, thereby turning off the pull-up transistor T6. As a result, the scan pulse is not output from the pull-up transistor T6.

In the case of a shift register constituted by only N-type transistors, it may be impossible to lower the voltage at a certain node below the discharge voltage of the discharge voltage source 'VSS'. For at least this reason, even when a transistor, the gate of which is connected to the node, is in a logically off state, leakage current flows through the transistor because a gate-source voltage 'Vgs' of the transistor is above 0.

In particular, when the threshold voltage of the transistor is negative, leakage current is increased and, as such, the circuit may operate abnormally.

Similarly, in the stage shown in FIG. 1, for the same reason as mentioned above, some of the charges supplied to the Q-node to turn on the pull-up transistor T6, namely, charges B, may leak to the discharge voltage source 'VSS' via the Q-node control switching element T2. In this case, the stage may operate abnormally.

The above-mentioned reason will be described in detail with reference to FIGS. 2 to 4.

When an N-type oxide semiconductor transistor is employed in the shift register, it is preferred that the threshold voltage of the transistor be positive. However, the threshold voltage of the transistor is varied in a negative direction in accordance with an increase in temperature, as shown in FIG. 3. The threshold voltage of the transistor may be varied in a negative direction for various reasons other than temperature.

In this case, the N-type oxide semiconductor transistor T2, which should be turned off in a period that the scan pulse is output from the stage, may not be turned off and, as such, leakage current may be generated. Due to such leakage current, the voltage at a set node may be lowered and, as such, a normal output may not be generated from the stage.

When no leakage current is generated from the Q-node control switching element T2, a start signal 'Vst' is supplied to the stage, as shown in FIGS. 2 and 4(a). In this case, when the scan pulse 'SS' ('Vout') is output from the stage, the Q-node signal supplied to the Q-node is normally boot-strapped by the scan pulse 'SS'. As a result, the scan pulse 'SS' may be normally output.

However, when leakage current is generated from the Q-node control switching element T2, the Q-node signal supplied to the Q-node when the scan pulse 'SS' is generated cannot be normally boot-strapped by the scan pulse 'SS', as shown in FIG. 4(b). As a result, the waveform of the scan pulse 'SS' output from the stage is varied and, as such, the circuit driven by the scan pulse may operate abnormally.

SUMMARY OF THE INVENTION

Accordingly, the present disclosure is directed to a shift register that substantially obviates one or more problems due to limitations and disadvantages of the related art.

An object of the present disclosure is to provide a shift register capable of preventing charges supplied to a Q-node to turn on a pull-up transistor for outputting a scan pulse from leaking outwards.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a shift register includes a plurality of stages connected to gate lines formed at a panel, wherein each of the stages includes a scan signal generator for generating a scan pulse or a turn-off signal, a scan pulse controller for generating a Q-node control signal for generation of the scan pulse, a Q-node adjuster for preventing the Q-node control signal from leaking outwards during supply of the Q-node control signal to a Q-node connected to the scan signal generator, and a turn-off signal controller for transferring a Qb-node control signal for generation of the turn-off signal to the scan signal generator via a Qb-node when no scan pulse is generated from the scan signal generator.

Embodiments further relate to a shift register including a plurality of stages connected to gate lines formed at a display. The stages include a scan pulse controller, a turn-off signal controller, a scan signal generator and a Q-node adjuster circuit. The scan pulse controller generates a Q-node control signal at a Q-node. The turn-off signal controller generates a Qb-node control signal at a Qb-node. The Qb-node control signal is an inverse of the Q-node control signal. The scan signal generator generates a scan pulse based on the Q-node control signal at the Q-node or generates a turn-off signal based on the Qb-node control signal at the Qb-node. The Q-node adjuster circuit includes first and second switching elements. The first switching element is controlled by a first control signal and is connected between the Q-node and a first connection node. The second switching element is controlled by the first control signal and is connected between the first connection node and a second control signal. The Q-node adjuster circuit is configured to supply a third control signal to the first connection node in relation to the first control signal to ensure the first switching element is turned off during supply of the Q-node control signal to the Q-node.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings:

FIG. 4(*b*) is a timing diagram depicting waveforms when the conventional shift register of FIG. 1 operates abnormally.

DETAILED DESCRIPTION OF THE INVENTION

Reference will now be made in detail to the preferred embodiments of the present disclosure, examples of which are illustrated in the accompanying drawings. The shift register according to the present disclosure may be applied to a liquid crystal display (LCD) device, an organic light emitting display device, and various other display devices. In the following description, however, the present disclosure will be described in detail in conjunction with an example in which the present disclosure is applied to an organic light emitting display device.

Figure 1:
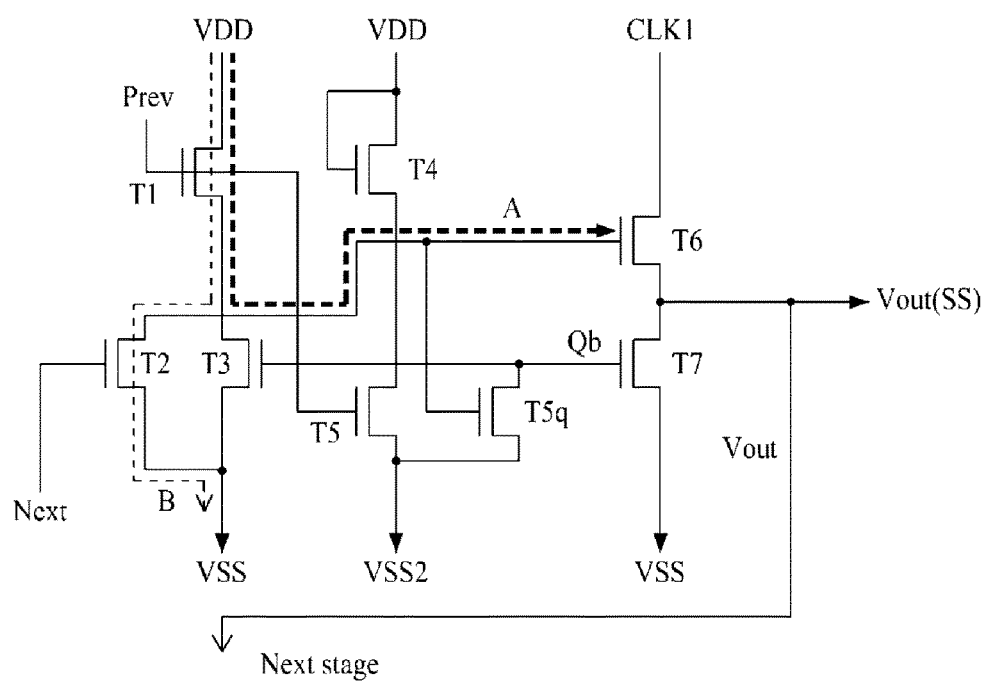
FIG. 1 is a circuit diagram illustrating a configuration of a stage applied to a conventional shift register.
Figure 2:
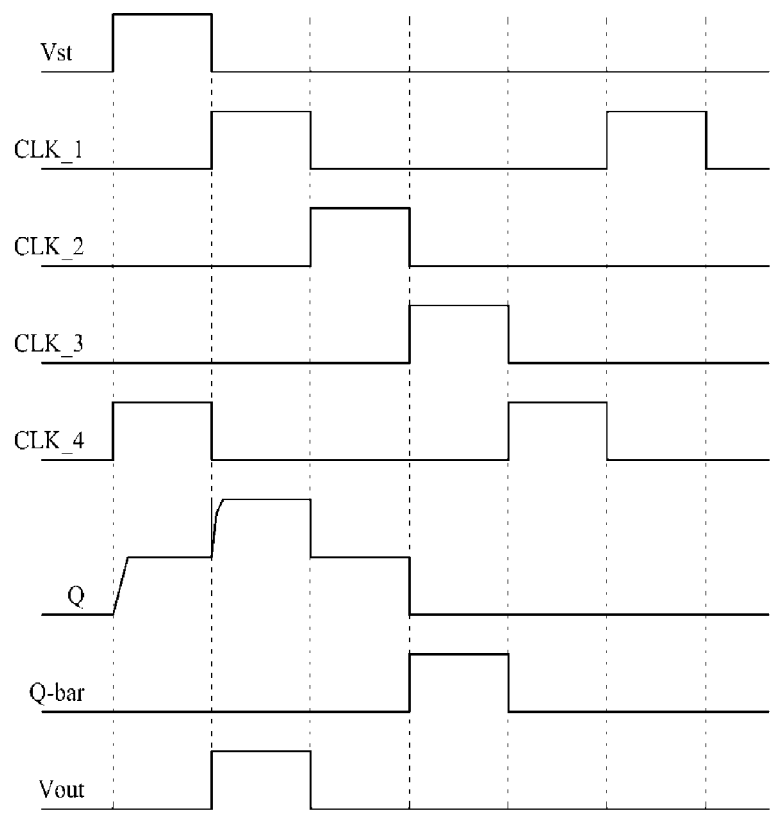
FIG. 2 is a timing diagram depicting waveforms of input and output signals of the stage applied to the conventional shift register of FIG. 1.
Figure 3:
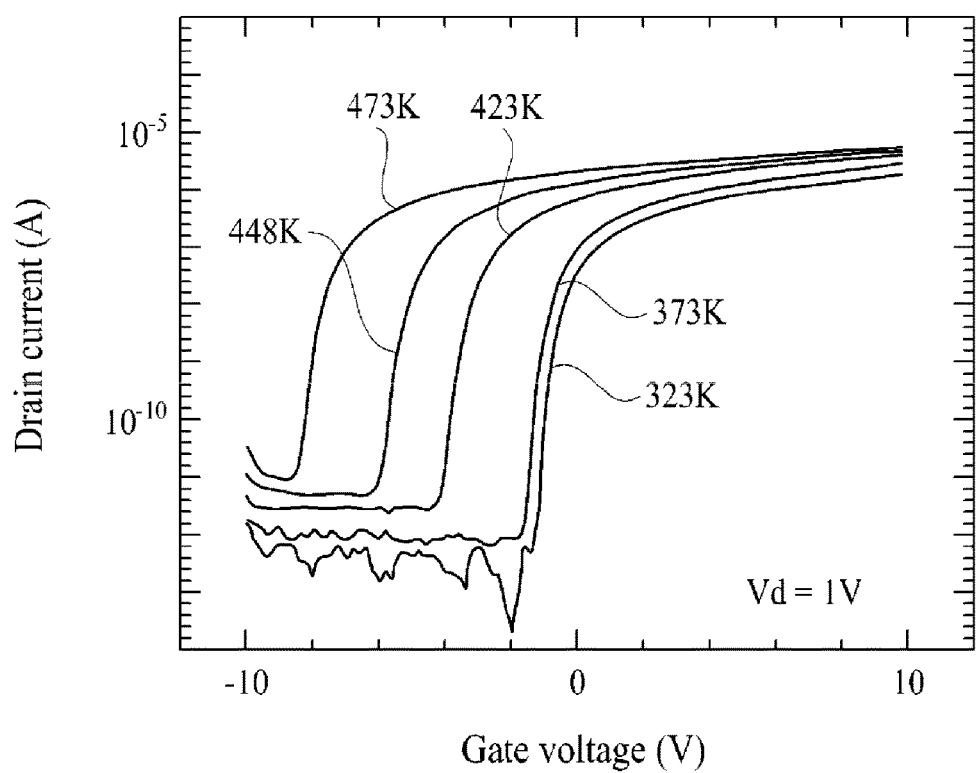
FIG. 3 is a diagram illustrating characteristics of a relationship between gate voltage and drain current according to temperature of a conventional oxide semiconductor transistor.
Figure 4A:
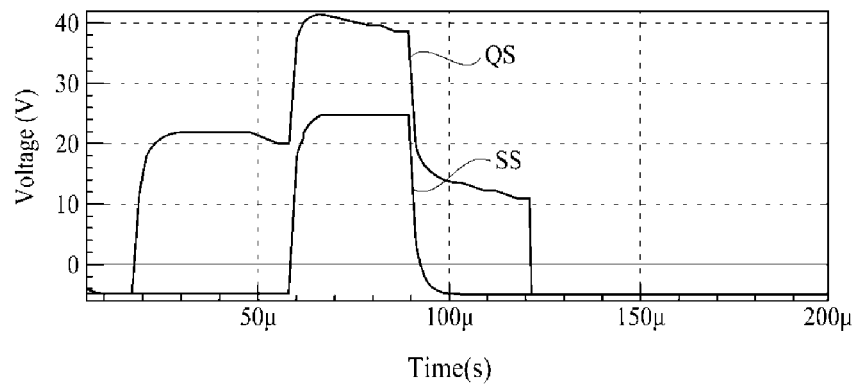
FIG. 4(*a*) is a timing diagram depicting waveforms when the conventional shift register of FIG. 1 operates normally.
Figure 4B:
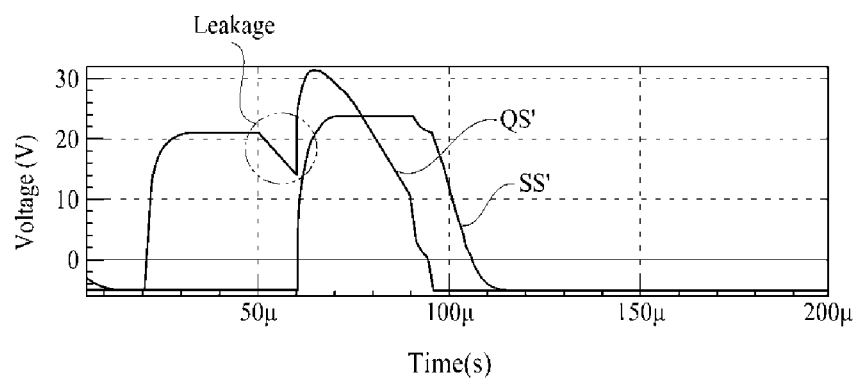
Figure 5:
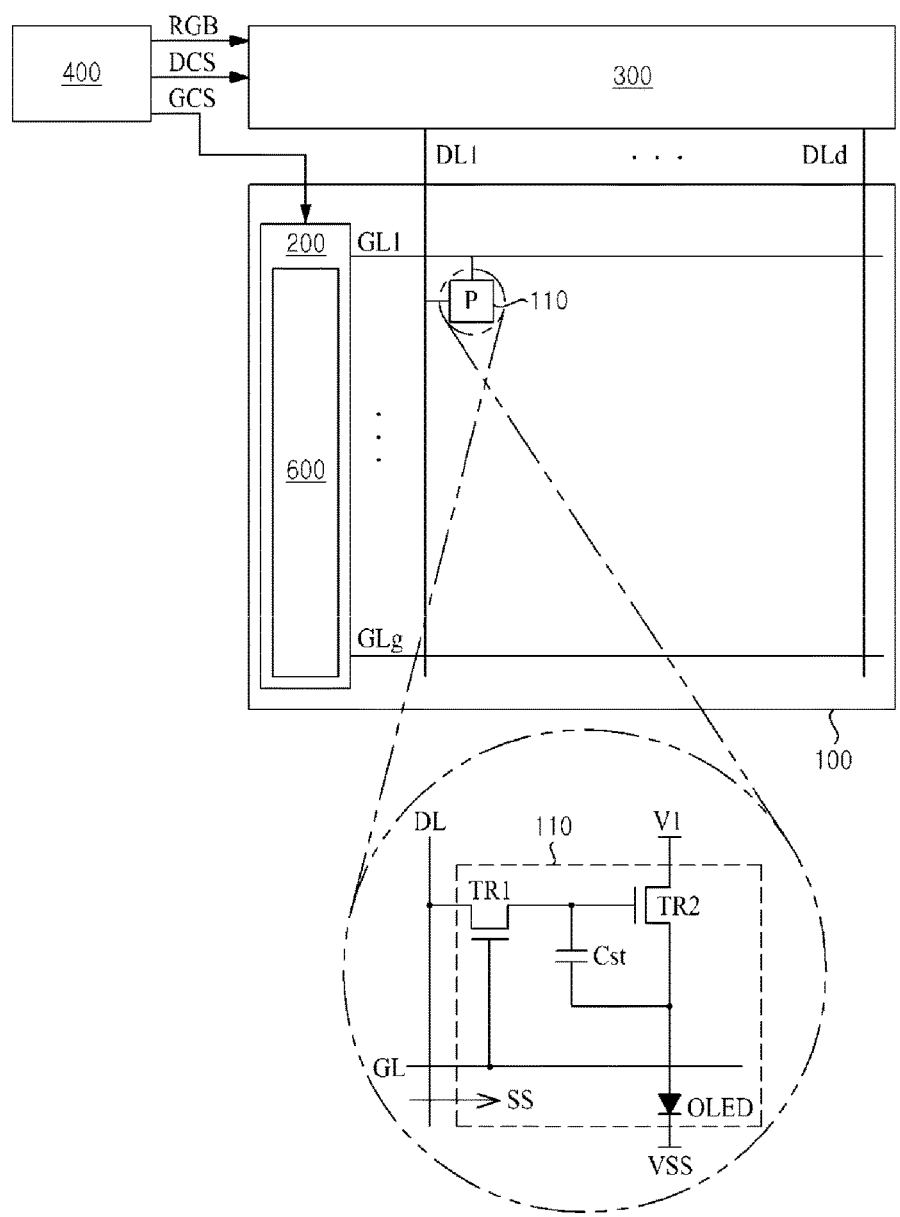
FIG. 5 is a diagram illustrating an organic light emitting display (OLED) device, according to the present disclosure.

FIG. 5 is a diagram illustrating an organic light emitting display (OLED) device, according to the present disclosure.

As illustrated in FIG. 5, the organic light emitting display device, to which the shift register according to the present disclosure is applied, includes a panel 100 including pixels 'P' formed at respective intersection regions between gate lines 'GL1' to 'GLg' and data lines 'DL1' to 'DLd', a gate driver 200 including a shift register 600 to sequentially supply a scan pulse to the gate lines 'GL1' to 'GLg' formed at the panel 100, and a data driver 300 for supplying a data voltage to the data lines 'DL1' to 'DLd' formed at the panel 100. The organic light emitting display device further includes a timing controller 400 for controlling functions of the gate driver 200 and data driver 300.

The pixels 'P', which are designated by reference numeral "110", are formed at respective intersection regions between a plurality of gate lines 'GL' and a plurality of data lines 'DL'.

As illustrated in an enlarged circle of FIG. 5, each pixel 'P' 110 may include an organic light emitting diode (OLED), two transistors, TR1 and TR2, connected to one data line 'DL' and one gate line 'GL', to control the OLED, and a storage capacitor (Cst). In this case, the pixel 'P' 110 illustrated in FIG. 5 is a pixel having an ideal structure including two transistors, TR1 and TR2. However, the pixel 110 may include three or more transistors.

That is, each pixel 'P' of an organic light emitting display device generally includes various compensation circuits to eliminate luminance non-uniformity, for example, mura or the like. To this end, each pixel 'P' 110 of the organic light emitting display device, to which the shift register according to the present disclosure is applied, may include three or more transistors. For example, five or more transistors may be provided.

Meanwhile, only one scan signal 'SS' may be required to drive each pixel 'P' 110. However, two scan signals or three or more scan signals may be required.

In addition to such a scan signal 'SS', various control signals, for example, an emission signal 'EM' to control an emission transistor, may be supplied to each pixel 'P' 110.

In this case, the scan signal 'SS' includes a scan pulse to turn on the transistors formed at each pixel 'P' 110. The scan pulse is supplied in a sequential manner to the pixels 'P' 110 via the gate lines 'GL'.

The scan pulse is supplied in a sequential manner to the gate lines 'GL' via the shift register constituting the gate driver 200.

The circuit constituting the pixel 'P' 110 illustrated in FIG. 5 is illustrative for description of the present disclosure. Accordingly, the present disclosure is not limited to such a pixel structure.

The timing controller 400 outputs gate control signals 'GCS' to control the gate driver 200 and data control signals 'DCS' to control the data driver 300, using vertical and horizontal synchronization signals 'V' and 'H' and a clock signal 'CLK', which are supplied from an external system (not shown).

The gate control signals 'GCS' include a gate start pulse 'GSP', a gate shift clock 'GSC', a gate output enable signal 'GOE', a start signal 'VST', a gate clock 'GCLK', etc. In addition, the gate control signals 'GCS' may include various control signals to control the shift register 600.

The data control signals 'DCS', which are generated from the timing controller 400, include a source start pulse 'SSP', a source shift clock signal 'SSC', a source output enable signal 'SOE', a polarity control signal 'POL', etc.

In addition, the timing controller 400 samples input image data received from the external system, and rearranges the sampled image data. The timing controller 400 supplies the resultant rearranged digital image data to the data driver 300.

That is, the timing controller 400 rearranges input image data supplied from the external system, and transfers rearranged digital image data to the data driver 300. The timing controller 400 also generates gate control signals 'GCS' to control the gate driver 200 and data control signals 'DCS' to control the data driver 300, using a clock signal 'CLK', a horizontal synchronization signal 'Hsync' and a vertical synchronization signal 'Vsync', which are supplied from the external system (not shown). The timing controller 400 transfers the gate control signals 'GCS' and data control signals 'DCS' to the associated gate driver 200 and data driver 300.

The data driver 300 converts the image data received from the timing controller 400 into analog data voltages, and supplies data voltages corresponding to one horizontal line to the data lines 'DL' in every horizontal period in which the gate pulse is supplied to one of the gate lines 'GL'.

The gate driver 200 has a gate in panel (GIP) structure in which the gate driver 200 is built in the panel 100. In this case, the gate control signals 'GCS' to control the gate driver 200 may include a start signal 'VST', a gate clock 'GCLK', etc.

The gate driver 200 supplies a scan pulse in a sequential manner to the gate lines 'GL1' to 'GLg' of the panel 100 in response to the gate control signals received from the timing controller 400. As a result, thin film transistors (TFTs) formed at each pixel 'P' 110 of one horizontal line, to which the current scan pulse is input, are turned on and, as such, an image may be output to the pixel 'P' 110.

In particular, the above-described functions are achieved in the shift register 600 according to the present disclosure, which constitutes the gate driver 200.

That is, the shift register 600 sequentially supplies the scan pulse to the gate lines for one frame, using the start signal 'VST', gate clock 'GCLK', etc. received from the timing controller 400. Here, "one frame" means a period during which one image is output through the panel 100.

The scan pulse has a turn-on voltage capable of turning on a switching element (thin film transistor) formed at each pixel 'P' 110.

The shift register 600 supplies a turn-off signal capable of turning off the switching element of each pixel 'P' 110 to the gate lines 'GL' during the remaining period of one frame in which no scan pulse is supplied.

In the following description, the scan pulse and turn-off signal will be generally referred to as a "scan signal". That is, the scan signal includes a scan pulse having a turn-on voltage capable of turning on the switching element of each pixel 'P' 110 connected to each gate line 'GL', and a turn-off signal for maintaining the switching element in an off state for a remaining period of one frame.

Figure 6:
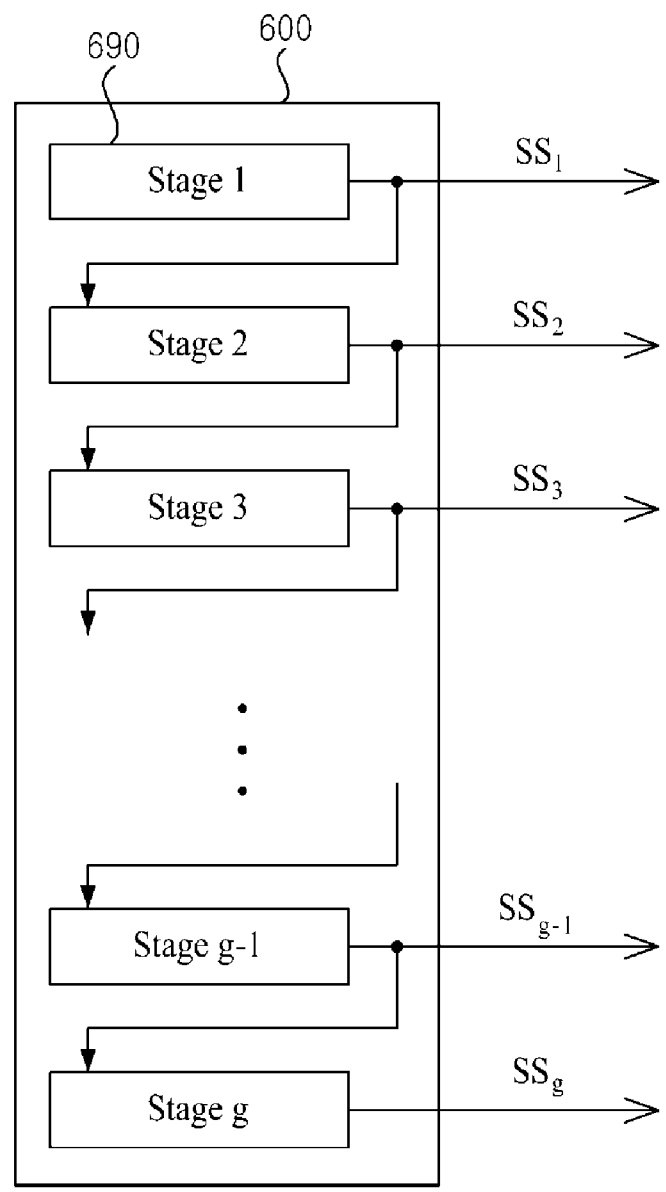
FIG. 6 is a diagram illustrating a configuration of the shift register, according to the present disclosure.
Figure 7:
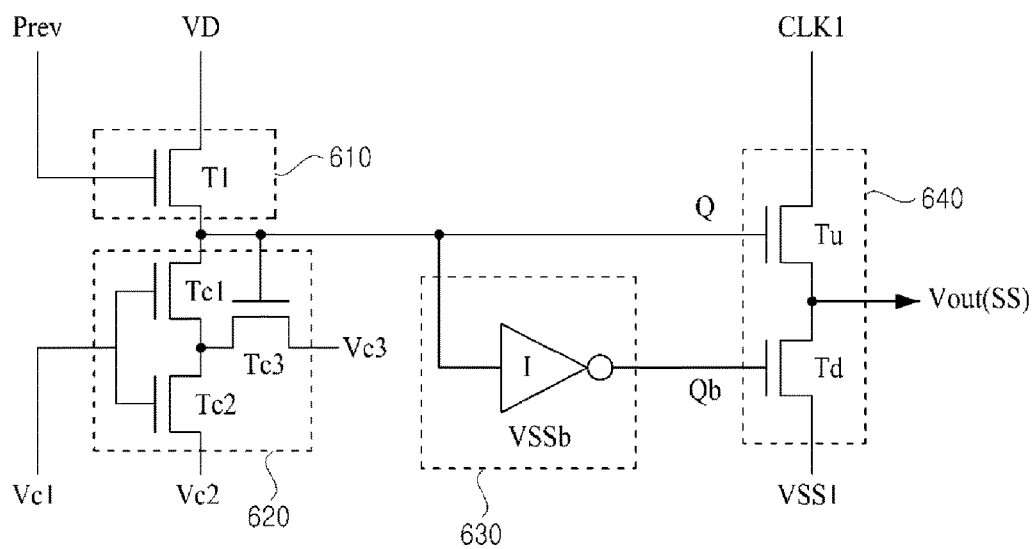
FIG. 7 is a diagram illustrating a configuration of one of the stages applied to the shift register of FIG. 6, according to the present disclosure.

FIG. 6 is a diagram illustrating a configuration of the shift register, according to the present disclosure. FIG. 7 is a diagram illustrating a configuration of one of stages applied to the shift register of FIG. 6, according to the present disclosure.

As illustrated in FIG. 6, the shift register 600, according to the present disclosure, includes 'g' stages 690, that is, stages 'ST1' to 'STg'.

The shift register 600 according to the present invention transfers one scan signal to pixels 'P' 110 formed at one horizontal line via one gate line 'GL' formed at the horizontal line. The gate lines 'GL' are connected to the stages 690, respectively.

Accordingly, since 'g' gate lines 'GL1' to 'GLg' are formed at the panel 100, 'g' stages 690, that is, stages 'ST1' to 'STg', are formed at the shift register 600.

As illustrated in FIG. 7, each stage 690 includes a scan signal generator 640 for generating a scan pulse or a turn-off signal, a scan pulse controller 610 for generating a Q-node control signal for generation of the scan pulse, a Q-node adjuster 620 for preventing the Q-node control signal from leaking outwards during supply of the Q-node control signal to the Q-node connected to the scan signal generator 640, and a turn-off signal controller 630 for transferring a Qb-node control signal for generation of the turn-off signal to the scan signal generator 640 via a Qb-node when no scan pulse is generated from the scan signal generator 640.

The scan signal generator 640 includes a pull-up transistor 'Tu' for outputting a first clock 'CLK1' as the scan pulse when turned on in accordance with the Q-node control signal, and a pull-down transistor 'Td' for outputting a turn-off voltage supplied from the turn-off voltage source 'VSS1' as the turn-off signal when turned on in accordance with the Qb-node control signal.

In the following description, the present disclosure will be described in conjunction with an example in which the transistors constituting the stage are N-type transistors, for convenience of description.

Accordingly, the turn-off voltage supplied from the turn-off voltage source 'VSS1' is a low-level voltage, and the scan pulse has a high-level voltage. In addition, the turn-off signal has a low-level voltage.

The scan pulse controller 610 transfers the Q-node control signal for generation of the scan pulse to the scan signal generator 640 via the Q-node.

As illustrated in FIG. 7, the scan pulse controller 610 includes a scan pulse generator transistor 'T1' connected between the gate of the pull-up transistor 'Tu' (hereinafter, simply referred to as a "Q-node") and a supply voltage source 'VD'. A carry signal ('Prev') output from the previous stage is input to the gate of the scan pulse generator transistor 'T1'.

The scan pulse generator transistor 'T1' is turned on by the carry signal 'Prev' and, as such, transfers the Q-node control signal to the gate of the pull-up transistor 'Tu' via the Q-node. Here, the Q-node control signal is a voltage supplied from the supply voltage source 'VD'.

The carry signal 'Prev' may be the scan pulse output from the previous stage. In this case, the previous stage may be the stage arranged just upstream of the stage illustrated in FIG. 7. Otherwise, the previous stage may be the stage spaced from the stage illustrated in FIG. 7 in an upstream direction under the condition that at least one stage is arranged therebetween.

The carry signal 'Prev' may also be a start signal 'Vst' transferred from the timing controller 400.

In addition to the carry signal 'Prev', various control signals to be input to the stage may be input to the gate of the transistor 'T1'.

The turn-off signal controller 630 performs transfers the Qb-node control signal for generation of the turn-off signal via the Qb-node when no scan pulse is generated from the scan signal generator 640.

As described above, data voltages are output to the data lines for every horizontal period by the turn-on voltage capable of turning on the switching element of each pixel connected to the gate line. For the remaining period of one frame the turn-off signal for maintaining the switching element in an off state should be output to the gate line.

To this end, the turn-off signal controller 630 transfers the Qb-node control signal to the pull-down transistor 'Td' of the scan signal generator 640 via the Qb-node for the remaining period of one frame, except for the horizontal period.

The pull-down transistor 'Td' is turned on by the Qb-node control signal supplied from the turn-off signal controller 630 and, as such, the turn-off signal is output to the gate line.

When the pull-down transistor 'Td' is turned on, the pull-up transistor 'Tu' should be turned off. On the other hand, when the pull-down transistor 'Td' is turned off, the pull-up transistor 'Tu' should be turned on. To this end, the turn-off signal controller 630 may include an inverter 'I' connected between the Q-node and the Qb-node.

The inverter 'I' may invert polarity of the Q-node control signal, and may transfer the polarity-inverted Qb-node control signal to the pull-down transistor 'Td' via the Qb-node. The voltage of the Qb-node control signal is determined by a high-level voltage VD and a low-level voltage 'VSSb', which are applied to the inverter 'I'.

Various kinds of inverters may be applied to the inverter 'I' constituting the turn-off signal controller 630.

The Q-node adjuster 620 prevents the Q-node control signal for output of the scan pulse from leaking outwards when the Q-node control signal is transferred to the scan signal generator 640.

In this case, the Q-node adjuster 620 may be connected between a reset voltage source 'Vc2' to output a reset signal capable of resetting the scan signal generator 640 and the Q-node.

That is, the Q-node adjuster 620 resets the scan signal generator 640, using the reset signal, when no scan pulse is output from the scan signal generator 640, thereby turning off the pull-up transistor 'Tu'.

In this case, the Q-node control signal may leak to the reset voltage source 'Vc2' via the Q-node adjuster 620 when the Q-node control signal is supplied to the pull-up transistor 'Tu', as mentioned in conjunction with the related art.

In order to avoid such a phenomenon, the Q-node adjuster 620 performs a function of disconnecting the Q-node from the reset voltage source 'Vc2' when the Q-node control signal is transferred to the scan signal generator 640.

In detail, in order to prevent output of the scan pulse, in accordance with a first control signal supplied from a first control signal supplier 'Vc1', the Q-node adjuster 620 transfers a second control signal supplied from a second control signal supplier 'Vc2' to the scan signal generator 640. In this case, the second control signal supplier 'Vc2' may be the reset voltage source.

In addition, the Q-node adjuster 620 disconnects the Q-node from the second control signal supplier 'Vc2' in accordance with a third control signal supplied from a third control signal supplier 'Vc3' when the Q-node control signal is transferred to the scan signal generator 640.

The Q-node adjuster 620 includes a first transistor 'Tc1' connected to the Q-node while being connected, at the gate thereof, to the first control signal supplier 'Vc1', a second transistor 'Tc2' connected between the second control signal supplier 'Vc2' and the first transistor 'Tc1' while being connected, at the gate thereof, to the first control signal supplier 'Vc1', and a third transistor 'Tc3' connected to the third control signal supplier 'Vc3' and a connection node between the first transistor 'Tc1' and the second transistor 'Tc2' while being connected, at the gate thereof, to the Q-node.

The Q-node adjuster 620 performs a function of turning off the first transistor 'Tc1', using the first and third control signals, when the Q-node control signal is transferred to the scan signal generator 640. This will be described in detail with reference to FIG. 8.

In order to prevent output of the scan pulse, the Q-node adjuster 620 also turns on the first and second transistors 'Tc1' and 'Tc2', using the first and third control signals, thereby connecting the Q-node to the second control signal supplier 'Vc2'.

That is, when the second control signal supplier 'Vc2' is the reset voltage source for outputting the reset signal capable of turning off the pull-up transistor 'Tu', as described above, the reset signal is supplied from the second control signal supplier 'Vc2' to the pull-up transistor 'Tu' when the first and second transistors 'Tc1' and 'Tc2' are turned on by the first and third control signals.

Meanwhile, as described above, the scan pulse controller 610 generates the Q-node control signal, and transfers the generated Q-node control signal to the Q-node. The Q-node adjuster 620 prevents the Q-node control signal from leaking outwards during a period that the Q-node control signal is in a high-level state.

That is, even when the Q-node control signal is no longer generated from the scan pulse controller 610 in accordance with turning-off of the scan pulse generator transistor 'T1' of the scan pulse controller 610, the Q-node adjuster 620 continuously prevents the Q-node control signal from leaking outwards during a period that the Q-node control signal is in a high-level state.

Figure 8:
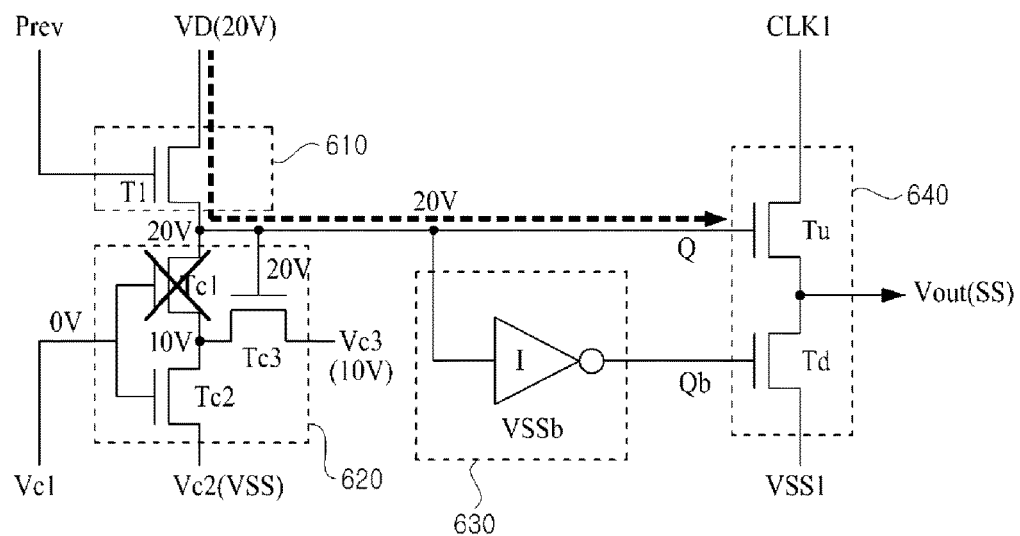
FIG. 8 is a diagram illustrating an operation method of one of the stages applied to the shift register of FIG. 6, according to the present disclosure.

FIG. 8 is a diagram explaining an operation method of one of stages applied to the shift register of FIG. 7, according to the present disclosure.

The Q-node adjuster 620 formed at the stage 690 applied to the shift register according to the present disclosure prevents the Q-node control signal to the second control signal supplier Vc2 during a period that the scan pulse is output from the scan signal generator 640, as described above. The Q-node adjuster 620 also supplies the reset signal capable of resetting the scan signal generator 640, that is, the signal capable of turning off the pull-up transistor 'Tu', to the gate of the pull-up transistor 'Tu' via the Q-node.

First, a method for preventing charges of the Q-node control signal from leaking to the second control signal supplier 'Vc2' in the Q-node adjuster 620 during a period that the scan pulse is output from the scan signal generator 640 will be described.

When the scan pulse generator transistor 'T1' formed at the scan pulse controller 610 is turned on by the carry signal 'Prev' transferred from the previous stage or various other control signals, the Q-node control signal capable of outputting the scan pulse is transferred to the gate of the pull-up transistor 'Tu' via the Q-node.

When the Q-node control signal is transferred to the Q-node, the first control signal from the first control signal supplier 'Vc1' is input to the gate of the first transistor 'Tc1'. The first control signal is a signal for turning off the first transistor 'Tc1'. In this case, even when the first transistor 'Tc1' is turned off, leakage current may flow through the first transistor 'Tc1' due to characteristic variation of the first transistor 'Tc1', as mentioned above in conjunction with the related art.

In order to avoid such a phenomenon, the third control signal from the third control signal supplier 'Vc3' is input to the third transistor 'Tc3', and the Q-node control signal is supplied to the gate of the third transistor 'Tc3'. When it is assumed that the voltage of the supply voltage source 'VD' supplied to the scan pulse controller 610 is 20V, the Q-node control signal, which is about 20V, is supplied to the Q-node. As a result, 20V is applied to the gate of the third transistor 'Tc3'.

That is, the third transistor 'Tc3' is turned on by the Q-node control signal and, as such, the voltage of the third control signal supplier 'Vc3' (for example, 10V) is supplied to the connection node between the first transistor 'Tc1' and the second transistor 'Tc2'.

In this case, the first control signal (for example, 0V) capable of turning off the first transistor 'Tc1' is input to the gate of the first transistor 'Tc1', and 10V and 20V are applied to the source and drain of the first transistor 'Tc1', respectively.

Generally, when the gate voltage of a transistor is lower than the source and drain voltages of the transistor, the transistor is in an off state. Therefore, when the source and drain voltages of the first transistor 'Tc1' illustrated in FIG. 8 are 10V and 20V, respectively, and the gate voltage of the first transistor 'Tc1' is 0V, the first transistor 'Tc1' is surely in an off state.

In this case, the gate-source voltage 'Vgs' of the first transistor 'Tc1' is −10V and, as such, the first transistor Tc1 is maintained in an off state even when the threshold voltage of the first transistor 'Tc1' is more or less varied in a negative direction.

That is, the first transistor 'Tc1' is surely in an off state by the first and third control signals during a period that the scan pulse is output form the scan signal generator 640.

Accordingly, the Q-node control signal is prevented from leaking to the second control signal supplier 'Vc2' via the first transistor 'Tc1' during a period that the scan pulse is output from the scan signal generator 640.

In this case, the first to third control signals for preventing the Q-node control signal through the Q-node adjuster 620 may be diversely set.

Figure 10A:
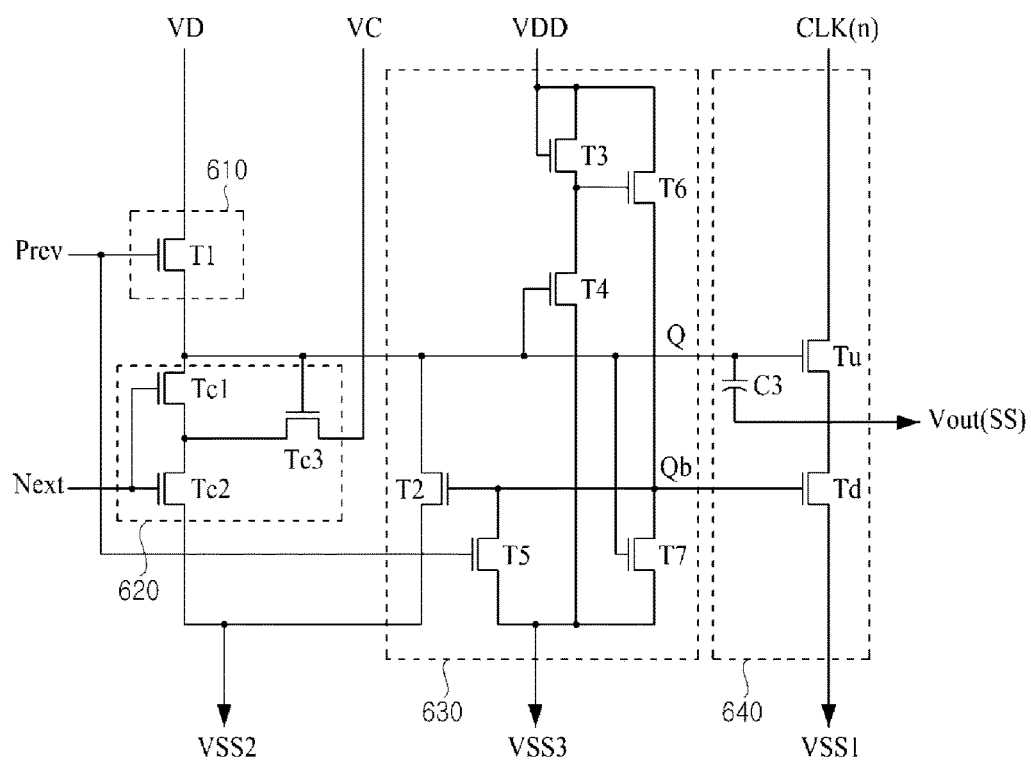
FIG. 10A is a diagram illustrating another detailed configuration of one of the stages applied to the shift register of FIG. 6, according to the present disclosure.

In a first example as illustrated in FIG. 10A, the first control signal may be the scan pulse (carry signal) output from the next stage, the second control signal may be the discharge voltage, and the third control signal may be the control voltage for performing the above-described function.

Figure 10B:
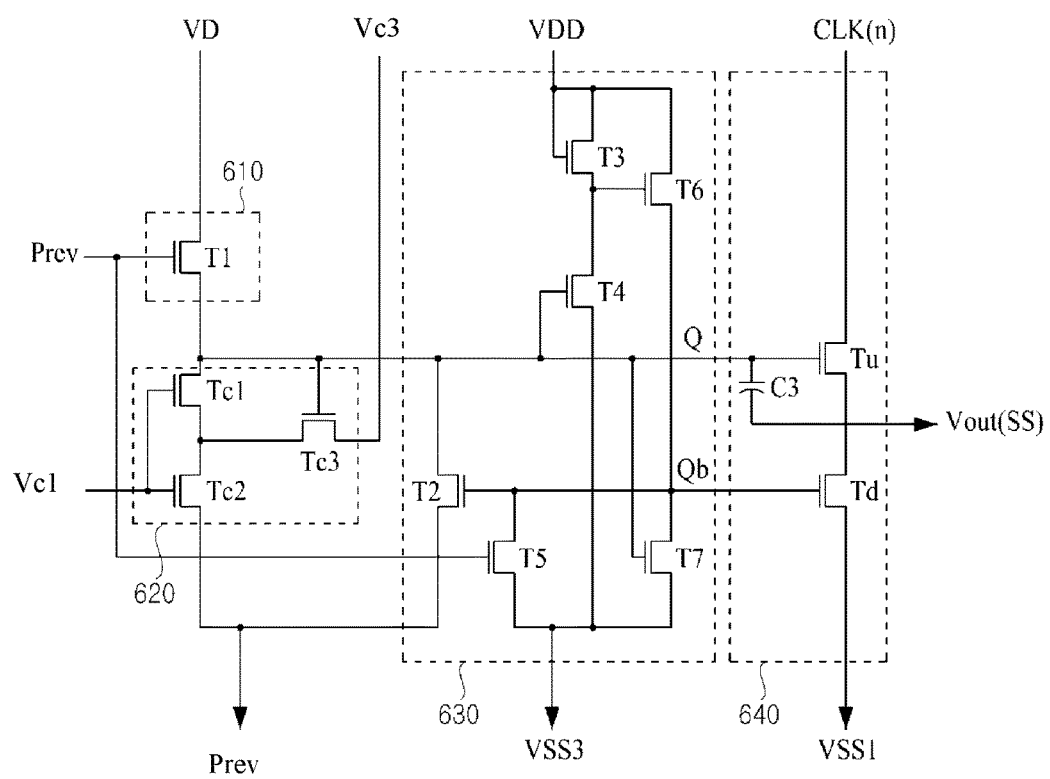
FIG. 10B is a diagram illustrating yet another detailed configuration of one of the stages applied to the shift register of FIG. 6, according to an embodiment.

In a second example as illustrated in FIG. 10B, the first control signal may be the clock pulse for performing the above-described function, the second control signal may be the scan pulse (carry signal) output from the previous stage (e.g., Prev), and the third control signal may be the control voltage for performing the above-described function.

In a third example, the first control signal may be the reset signal transferred to the reset node to reset the scan signal generator 640, the second control signal may be the discharge voltage, and the third control signal may be the control voltage for performing the above-described function.

In addition to the above-described example, the first to third control signals may be set through various combinations.

Second, a method for resetting the pull-up transistor 'Tu' of the scan signal generator 640 during a period that the turn-off signal is output from the scan signal generator 640, thereby preventing the scan pulse from being output will be described.

When the scan pulse generator transistor 'T1' formed at the scan pulse controller 610 is tuned off by the signal transferred from the previous stage or various other control signals, the Q-node control signal capable of outputting the scan pulse is not supplied to the Q-node.

In this case, the first control signal capable of turning on the first transistor 'Tc1' is supplied from the first control signal supplier 'Vc1' of the Q-node adjuster 620.

When the first transistor 'Tc1' is turned on, the reset signal, namely, the signal capable of turning off the pull-up transistor 'Tu', is supplied from the second control signal supplier 'Vc2' (for example, a reset voltage source 'VSS') to the pull-up transistor 'Tu' via the Q-node.

When the pull-up transistor 'Tu' is turned off by the reset signal, the scan pulse cannot be output through the pull-up transistor 'Tu'.

That is, since the pull-up transistor 'Tu' is turned off by the reset signal transferred from the Q-node controller 620, no scan pulse is output from the scan signal generator 640 during a period that the turn-off signal is output from the scan signal generator 640.

In detail, the Q-node adjuster 620 performs functions of preventing the Q-node control signal from leaking outwards during a period that the scan pulse is output, using at least three control signals, and transferring the reset signal for preventing output of the scan pulse at a timing that the turn-off signal is output.

Figure 9:
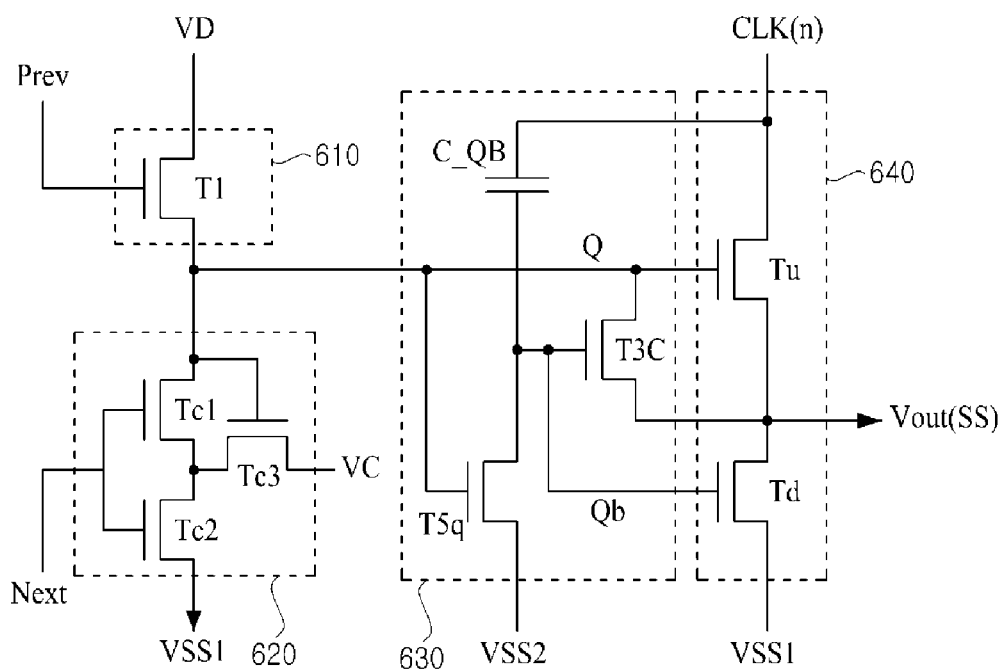
FIG. 9 is a diagram illustrating a detailed configuration of one of the stages applied to the shift register of FIG. 6, according to the present disclosure.

FIG. 9 is a diagram illustrating a detailed configuration of one of stages applied to the shift register, according to the present disclosure. FIG. 10A is a diagram illustrating another detailed configuration of one of stages applied to the shift register, according to the present disclosure, and FIG. 10B is a diagram illustrating yet another detailed configuration of one of the stages applied to the shift register, according to an embodiment. In the following description, contents identical or similar to those described with reference to FIGS. 6 to 8 will be omitted or briefly given.

Referring to FIGS. 9 and 10, the stage 690 applied to the shift register according to the present disclosure includes a scan signal generator 640 for generating a scan pulse or a turn-off signal, a scan pulse controller 610 for generating a Q-node control signal for generation of the scan pulse and for transferring the Q-node control signal to the scan signal generator 640 via a Q-node, a Q-node adjuster 620 for preventing the Q-node control signal from leaking outwards during supply of the Q-node control signal to the Q-node connected to the scan signal generator 640, and a turn-off signal controller 630 for transferring a Qb-node control signal for generation of the turn-off signal to the scan signal generator 640 via a Qb-node when no scan pulse is generated from the scan signal generator 640.

In this case, the configurations and functions of the scan pulse controller 610, Q-node controller 620, and scan signal generator 640 are identical to those described above.

That is, the stage 690 illustrated in FIG. 9 and includes the same configuration as the stage described with reference to FIG. 7 and performs the same functions as the previously-described stage, except that the turn-off signal controller 630 described as the inverter 'I' in FIG. 7 is shown through a concrete circuit diagram.

As described above, the turn-off signal controller 630 transfers the Qb-node control signal for generation of the turn-off signal via the Qb-node when no scan pulse is generated from the scan signal generator 640.

For example, in the turn-off signal controller 630 illustrated in FIG. 9, a fifth transistor 'T5$q$' is turned on by the Q-node control signal for outputting the scan pulse. Through the fifth transistor 'T5$q$', the low-level voltage 'VSS2' is supplied to the third transistor 'T3$c$' and pull-down transistor 'Td'.

Accordingly, the pull-down transistor 'Td' is turned off during a period that the Q-node control signal is supplied to the pull-up transistor 'Tu' and, as such, the scan pulse is output. As a result, the turn-off signal is not output to the gate line.

However, when output of the scan pulse is stopped, the pull-down transistor 'Id' is periodically turned on by a capacitor 'C_QB' connected to the clock 'CLK'. Accordingly, the turn-off signal, which has the low-level voltage 'VSS1', is output to the gate line via the pull-down transistor 'Id'.

In another example, in the turn-off signal controller 630 illustrated in FIG. 10A or 10B, a seventh transistor 'T7' is turned on by the Q-node control signal for outputting the scan pulse and the control signal for turning on the scan pulse generator transistor 'T1'. Through the seventh transistor 'T7', a low-level voltage 'VSS3' is supplied to the pull-down transistor 'Td'.

Accordingly, the pull-down transistor 'Id' is turned off during a period that the Q-node control signal is supplied to the pull-up transistor 'Tu' and, as such, the scan pulse is output. As a result, the turn-off signal is not output to the gate line.

However, when output of the scan pulse is stopped, the pull-down transistor 'Id' is turned on by a high-level signal supplied thereto via a sixth transistor 'T6'. Accordingly, the turn-off signal, which has the low-level voltage 'VSS1', is output to the gate line via the pull-down transistor 'Id'.

Figure 11:
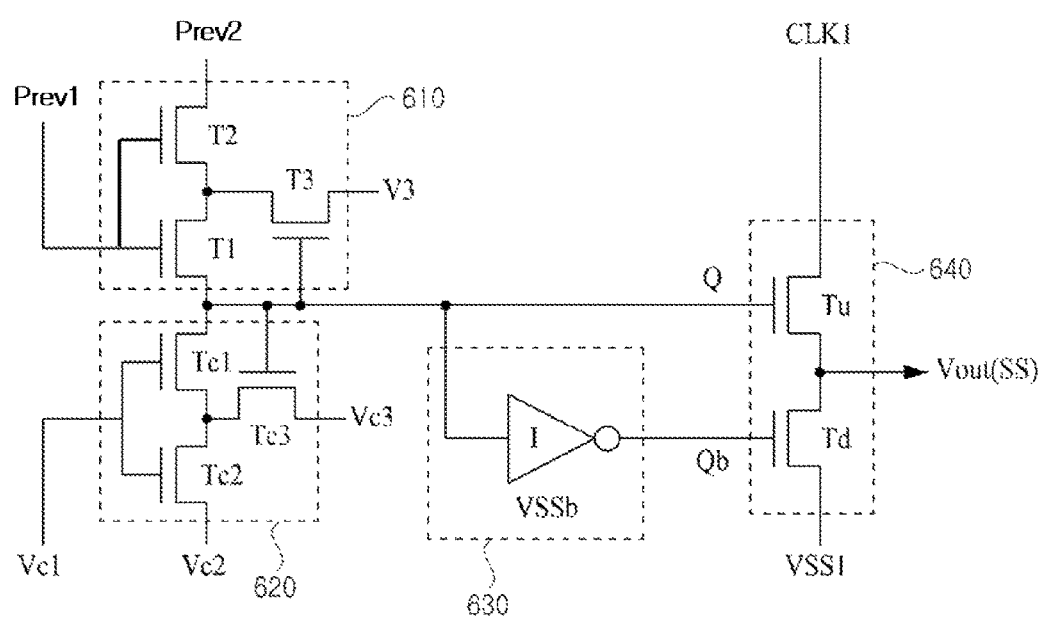
FIG. 11 is a diagram illustrating another detailed configuration of one of the stages applied to the shift register of FIG. 6, according to the present disclosure.

FIG. 11 is a diagram illustrating another detailed configuration of one of stages applied to the shift register according to the present disclosure. In the following description, contents identical or similar to those described with reference to FIG. 7 will be omitted or briefly given.

In conjunction with the stage 690 described with reference to FIGS. 7 to 10, the case, in which charges of the Q-node control signal leak through the Q-node controller 620 including the reset voltage source 'Vc2' to output the reset signal, has been described as an example of the present disclosure.

However, the Q-node control signal may leak through the scan pulse controller 610.

For example, when the scan pulse controller 610 generates the Q-node control signal, using a signal output from the previous stage, namely, the scan pulse (or the carry signal), the Q-node control signal may leak to the previous stage.

That is, as illustrated in FIG. 11, when the scan pulse controller 610 generates the Q-node control signal, using signals 'Prev1' and 'Prev2' output from the previous stage, the Q-node control signal may be output to the previous stage during a period that the scan pulse is output.

In order to avoid such a phenomenon, the scan pulse controller 610 may have a configuration similar to that of the Q-node controller 620.

In this case, the scan pulse controller 610 may include a first transistor 'T1' connected to the Q-node while being connected, at the gate thereof, to a first control signal supplier 'Prev1', a second transistor 'T2' connected between a second control signal supplier 'Prev2' and the first transistor 'T1' while being connected, at the gate thereof, to the first control signal supplier 'Prev1', and a third transistor 'T3' connected to a third control signal supplier 'V3' and a connection node between the first transistor 'T1' and second transistor 'T2' while being connected, at the gate thereof, to the Q-node.

Operation methods and functions of the first to third transistors 'T1' to 'T3' are identical to those of the first to third transistors 'Tc1' to 'Tc3' described with reference to FIG. 7.

In this case, the first and second control signals supplied from the first and second control signal suppliers 'Prev1' and 'Prev2' may be signals output from the same stage or may be signals output from different stages.

The low-level voltages used to embody a low-level logic in the circuits illustrated in FIGS. 7 to 11, that is, the discharge voltages 'VSS', 'VSS1', 'VSS2', 'VSS3', 'VSSb', etc., may be equal or different. When the discharge voltages are equal, they may be supplied to the circuits via the same power line.

As apparent from the above description, in the shift register according to the present disclosure, it may be possible to prevent charges supplied to a Q node to turn on a pull-up transistor for outputting a scan pulse from leaking outwards when the scan pulse is output from a stage. Accordingly, the scan pulse may be stably output.

It will be apparent to those skilled in the art that various modifications and variations can be made in the present invention without departing from the spirit or scope of the disclosure. Thus, it is intended that the present disclosure covers the modifications and variations of this disclosure provided they come within the scope of the appended claims and their equivalents.

What is claimed is:
1. A shift register comprising:
a plurality of stages connected to gate lines formed at a panel,
wherein each of the stages comprises:
a scan signal generator for generating a scan pulse or a turn-off signal, the scan signal generator comprising a pull-up transistor coupled in series to a pull-down transistor;
a scan pulse controller for generating a Q-node control signal for generation of the scan pulse;

a Q-node adjuster for preventing the Q-node control signal from leaking outwards during supply of the Q-node control signal to a Q-node connected to the scan signal generator, the Q-node adjuster comprising:
  a first transistor, a first drain of the first transistor coupled to a first gate of the pull-up transistor;
  a second transistor, a second drain of the second transistor coupled to a first source of the first transistor, a second source of the second transistor being supplied another scan pulse generated from a previous one of the plurality of stages; and
a turn-off signal controller for transferring a Qb-node control signal for generation of the turn-off signal to the scan signal generator via a Qb-node when no scan pulse is generated from the scan signal generator, the turn-off signal controller comprising:
  a third transistor, a third source of the third transistor coupled to a second gate of the pull-down transistor; and
  a fourth transistor, a third gate of the fourth transistor coupled to the first gate of the pull-up transistor, a third drain of the fourth transistor coupled to a fourth gate of the third transistor.

2. The shift register according to claim 1, wherein the Q-node adjuster is configured to output a reset signal at the Q-node for resetting the scan signal generator.

3. The shift register according to claim 1, wherein the Q-node adjuster prevents the Q-node control signal from leaking to the another scan pulse from the previous one of the plurality of stages during a period that the Q-node control signal is supplied to the Q-node.

4. The shift register according to claim 1, wherein the Q-node adjuster transfers said another scan pulse generated from the previous one of the plurality of stages supplied from a second control signal supplier to the scan signal generator in accordance with a first control signal supplied from a first control signal supplier, to prevent output of the scan pulse.

5. The shift register according to claim 4, wherein the Q-node adjuster disconnects the Q-node from the second control signal supplier in accordance with a third control signal supplied from a third control signal supplier during a period that the Q-node control signal is supplied to the Q-node.

6. The shift register according to claim 1, wherein the Q-node adjuster further comprises:
  a fifth transistor connected to a third control signal supplier and a connection node between the first transistor and the second transistor while being connected, at a fifth gate thereof, to the Q-node.

7. The shift register according to claim 6, wherein the Q-node adjuster turns off the first transistor during a period that the Q-node control signal is supplied to the Q-node, using a first control signal supplied to the first transistor and a third control signal supplied to the fifth transistor.

8. The shift register according to claim 6, wherein the Q-node adjuster turns on the first transistor and the second transistor using a first control signal supplied to the first transistor and a third control signal supplied to the fifth transistor, thereby connecting the Q-node to the another scan pulse generated from the previous one of the plurality of stages, to prevent output of the scan pulse.

9. The shift register according to claim 1, wherein the Q-node adjuster prevents output of the scan pulse at a timing that the turn-off signal is output.

10. The shift register according to claim 1, wherein, when the scan pulse controller generates the Q-node control signal using a signal output from a previous stage, the scan pulse controller prevents the Q-node control signal from leaking to the previous stage when the Q-node control signal is transferred to the scan signal generator.

11. The shift register of claim 1, wherein the turn-off signal controller further comprises:
  a fifth transistor, a fifth gate of the fifth transistor and a fourth drain of the fifth transistor coupled to a voltage source, a fourth source of the fifth transistor coupled to the fourth gate of the third transistor.

12. The shift register of claim 11, wherein the turn-off signal controller further comprises:
  a sixth transistor, a sixth gate of the sixth transistor coupled to the first gate of the pull-up transistor, a fifth drain of the sixth transistor coupled to the second gate of the pull-down transistor; and
  a seventh transistor, a seventh gate of the seventh transistor coupled to said another scan pulse generated from the previous one of the plurality of stages, a sixth drain of the seventh transistor coupled to the second gate of the pull-down transistor.

13. The shift register of claim 12, wherein the turn-off signal controller further comprises:
  a eighth transistor, an eighth gate of the eighth transistor coupled to the second gate of the pull-down transistor, a seventh drain of the eighth transistor coupled to the first gate of the pull-up transistor.

14. A shift register comprising:
a plurality of stages connected to gate lines formed at a display panel,
wherein each of the stages comprises:
  a scan pulse controller for generating a Q-node control signal at a Q-node;
  a Q-node adjuster circuit comprising:
    a first transistor, a first drain of the first transistor coupled to a first gate of a pull-up transistor;
    a second transistor, a second drain of the second transistor coupled to a first source of the first transistor, a second source of the second transistor being supplied another scan pulse generated from a previous one of the plurality of stages, the first transistor connected to the second transistor at a first connection node;
  wherein the Q-node adjuster circuit is configured to supply to the first connection node a first control signal to ensure turn off of the first transistor during supply of the Q-node control signal to the Q-node;
  a turn-off signal controller for generating a Qb-node control signal at a Qb-node, the Qb-node control signal being an inverse of the Q-node control signal, the turn-off signal controller comprising:
    a third transistor, a third source of the third transistor coupled to a second gate of a pull-down transistor; and
    a fourth transistor, a third gate of the fourth transistor coupled to the first gate of the pull-up transistor, a third drain of the fourth transistor coupled to a fourth gate of the third transistor; and
  a scan signal generator for generating a scan pulse based on the Q-node control signal at the Q-node or a turn-off signal based on the Qb-node control signal at the Qb-node, the scan signal generator comprising the pull-up transistor coupled in series to the pull-down transistor.

15. The shift register of claim 14, wherein the Q-node adjuster circuit further comprises a fifth transistor controlled by the Q-node control signal and connected between the first control signal and the first connection node.

16. The shift register of claim 14, wherein the Q-node adjuster circuit is further configured to:
   supply a second control signal to the first and second transistors to ensure turn on of the first and second transistors when the Q-node control signal is not supplied to the Q-node; and
   responsive to supplying the second control signal to the first and second transistors, transfer the another scan pulse generated from the previous one of the plurality of stages to the Q-node to reset the Q-node.

17. The shift register of claim 14, wherein the scan pulse controller comprises:
   a fifth transistor controlled by the another scan pulse generated from the previous one of the plurality of stages and connected between the Q-node and a second connection node, and
   a sixth transistor controlled by the another scan pulse generated from the previous one of the plurality of stages and connected to the second connection node;
   wherein the scan pulse controller is configured to supply to the second connection node a second control signal to ensure turn off of the fifth transistor during supply of the Q-node control signal to the Q-node.

18. The shift register of claim 17, wherein the scan pulse controller further comprises a seventh transistor controlled by the Q-node control signal and connected between the second control signal and the second connection node.

19. The shift register of claim 14, wherein the turn-off signal controller further comprises:
   a fifth transistor, a fifth gate of the fifth transistor and a fourth drain of the fifth transistor coupled to a voltage source, a fourth source of the fifth transistor coupled to the fourth gate of the third transistor.

20. The shift register of claim 19, wherein the turn-off signal controller further comprises:
   a sixth transistor, a sixth gate of the sixth transistor coupled to the first gate of the pull-up transistor, a fifth drain of the sixth transistor coupled to the second gate of the pull-down transistor; and
   a seventh transistor, a seventh gate of the seventh transistor coupled to said another scan pulse generated from the previous one of the plurality of stages, a sixth drain of the seventh transistor coupled to the second gate of the pull-down transistor; and
   a eighth transistor, an eighth gate of the eighth transistor coupled to the second gate of the pull-down transistor, a seventh drain of the eighth transistor coupled to the first gate of the pull-up transistor.

* * * * *